(12) United States Patent
Matsuoka

(10) Patent No.: US 10,587,061 B2
(45) Date of Patent: Mar. 10, 2020

(54) ELECTRICAL JUNCTION BOX

(71) Applicant: Sumitomo Wiring Systems, Ltd., Yokkaichi, Mie (JP)

(72) Inventor: Hideo Matsuoka, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 16/347,264

(22) PCT Filed: Oct. 17, 2017

(86) PCT No.: PCT/JP2017/037551
§ 371 (c)(1),
(2) Date: May 3, 2019

(87) PCT Pub. No.: WO2018/083976
PCT Pub. Date: May 11, 2018

(65) Prior Publication Data
US 2019/0288419 A1      Sep. 19, 2019

(30) Foreign Application Priority Data
Nov. 4, 2016   (JP) ................................ 2016-216519

(51) Int. Cl.
*H01R 12/55* (2011.01)
*B60R 16/023* (2006.01)
(Continued)

(52) U.S. Cl.
CPC ......... *H01R 12/55* (2013.01); *B60R 16/0239* (2013.01); *H01R 12/58* (2013.01);
(Continued)

(58) Field of Classification Search
None
See application file for complete search history.

(56) References Cited

U.S. PATENT DOCUMENTS 10,164,417 B2 * 12/2018 Kobayashi ............... H02G 3/16
2003/0133273 A1   7/2003 Nagaoka
(Continued)

FOREIGN PATENT DOCUMENTS

| JP | 2005-322557 A | 11/2005 |
| JP | 2006-049196 A | 2/2006 |

(Continued)

OTHER PUBLICATIONS

International Search Report, Application No. PCT/JP2017/037551, dated Dec. 26, 2017. ISA/Japan Patent Office.

*Primary Examiner* — Xanthia C Cunningham
(74) *Attorney, Agent, or Firm* — Honigman LLP

(57) ABSTRACT

Provided is an electrical junction box with a novel structure with which the occurrence of solder cracks can be advantageously avoided, while also achieving a reduction in manufacturing costs. In an electrical junction box including an terminal-equipped printed circuit board in which an intermediate section of a board terminal in the length direction is press-fitted into and held by a resin block, and a lead portion of the board terminal is connected to a conductive path of a printed circuit board by soldering, the resin block is formed of a flat-shaped printed circuit board base material, and is arranged on the printed circuit board with a gap therebetween, and the resin block is supported in a fixed position on the printed circuit board by a block-receiving portion that is separate from the resin block.

4 Claims, 3 Drawing Sheets

(51) Int. Cl.
*H02G 3/08* (2006.01)
*H05K 1/18* (2006.01)
*H01R 13/41* (2006.01)
*H01R 12/58* (2011.01)

(52) U.S. Cl.
CPC .............. *H01R 13/41* (2013.01); *H02G 3/08* (2013.01); *H05K 1/18* (2013.01)

(56) References Cited

U.S. PATENT DOCUMENTS

| | | | |
|---|---|---|---|
| 2004/0051399 A1* | 3/2004 | Hara | B60R 16/0238 307/149 |
| 2006/0141822 A1* | 6/2006 | Ozawa | H01R 9/2466 439/76.1 |
| 2009/0163085 A1* | 6/2009 | Makino | H01H 85/2035 439/701 |
| 2010/0263915 A1* | 10/2010 | Shiraiwa | H05K 1/0201 174/252 |
| 2015/0044901 A1* | 2/2015 | Doi | H01R 12/65 439/374 |
| 2015/0144392 A1* | 5/2015 | Sunaga | H01R 12/523 174/262 |
| 2016/0226167 A1* | 8/2016 | Ito | H01R 12/88 |

FOREIGN PATENT DOCUMENTS

| | | |
|---|---|---|
| JP | 2011-258429 A | 12/2011 |
| JP | 2015-035906 A | 2/2015 |

\* cited by examiner

ELECTRICAL JUNCTION BOX

CROSS-REFERENCE TO RELATED APPLICATIONS

This application is the U.S. national stage of PCT/JP2017/037551 filed on Oct. 17, 2017, which claims priority of Japanese Patent Application No. JP 2016-216519 filed on Nov. 4, 2016, the contents of which are incorporated herein.

TECHNICAL FIELD

The present disclosure relates to an electrical junction box which includes a terminal-equipped printed circuit board constituted by board terminals that are press-fitted into a resin block and held thereby standing upright on the printed circuit board.

BACKGROUND

Conventionally, terminal-equipped printed circuit boards are widely used as internal circuits of electrical junction boxes for vehicles. In this kind of terminal-equipped printed circuit board, lead portions provided on base end portions of board terminals are inserted into through holes of the printed circuit board and connected, by soldering, to conductive paths exposed in the through holes, whereas tab-shaped or tuning fork-shaped connection portions provided on tip end portions of the board terminals protrude on the printed circuit board, so that electrical components such as fuses and relays, connectors, and the like can be connected thereto.

Incidentally, when the lead portions of the board terminals are soldered to the conductive paths of the printed circuit board, a method is widely adopted in which intermediate sections of the board terminals in the length direction are press-fitted into and held by a resin block that is made of a synthetical resin and has leg portions as disclosed in JP 2003-217437A (JP 2003-217437A), for example, and flow or reflow soldering is performed in a state in which the board terminals are held on the printed circuit board via this leg-equipped resin block. In addition, when the printed circuit board is housed in the electrical junction box and used, the leg-equipped resin block also serves to support the insertion and removal force that occurs when a partner terminal is connected to or detached from the connection portion of a board terminal.

However, since this kind of leg-equipped resin block is formed of a synthetic resin material such as polypropylene whose linear expansion coefficient differs greatly from that of the base material of the printed circuit board, there is a problem in that when holding a board terminal using this kind of leg-equipped resin block, solder cracks tend to occur due to relative displacement between the board terminal and the printed circuit board based on the difference in linear expansion coefficients between the printed circuit board and the leg-equipped resin block, in cases such as when soldering is performed or in a state where the electrical junction box is mounted in the vehicle. Additionally, there is also an inherent problem in that the leg-equipped resin blocks have shapes that differ for each corresponding electric component or connector, and expensive molds are required for the respective shapes, and therefore an increase in costs is unavoidable.

The present disclosure has been conceived in view of the circumstances as described above, and a problem to be solved by the present disclosure is to provide an electrical junction box with a novel structure with which the occurrence of solder cracks can be advantageously avoided while achieving a reduction in manufacturing costs.

SUMMARY

A first aspect of the present disclosure is an electrical junction box including a terminal-equipped printed circuit board in which an intermediate section of a board terminal in a length direction is press-fitted into and held by a resin block and a lead portion of the board terminal is connected to a conductive path of the printed circuit board by soldering, the resin block being formed of a flat-shaped printed circuit board base material, and arranged on the printed circuit board with a gap therebetween, the resin block being supported at a fixed position on the printed circuit board by a block-receiving portion that is separate from the resin block, and a pair of through holes located below two end portions of the resin block pass through the printed circuit board, a pair of block-receiving portions are inserted into the through holes from a lower surface side of the printed circuit board and are arranged so as to protrude toward the resin block, and the two end portions of the resin block are placed on respective protruding end faces of the pair of block-receiving portions, and the resin block is thereby supported by only the pair of block-receiving portions.

According to this aspect, the resin block is formed of the printed circuit board base material. As such, compared to a conventional structure in which the resin block is formed of a resin material such as polypropylene, the problem of the occurrence of solder cracks due to relative displacement caused by the difference in linear expansion coefficients between the printed circuit board and the resin block is advantageously eliminated or reduced. Additionally, the resin block is flat-shaped, and the resin block can thus be formed simply by cutting the flat-shaped printed circuit board base material into a desired size and providing press-fit holes in the base material. Accordingly, unlike conventional leg-equipped resin blocks, it is not necessary to prepare a mold for each block, and thus manufacturing costs can be reduced.

Furthermore, positioning and fixing the flat-shaped resin block with respect to the printed circuit board can be performed using a jig when soldering is performed, and when in use, the resin block can be supported in a fixed position on the printed circuit board by the separate block-receiving portion. As such, even when a flat-shaped resin block without leg portions is adopted, the soldering process can be performed without issue, and supporting the insertion and removal force that occurs when in use can also be realized by the separate block-receiving portion. Furthermore, in this aspect, through holes for inserting and arranging the block-receiving portion are formed in the printed circuit board. As such, when soldering the board terminal, it is possible to position and arrange the jig so as to be inserted into the through holes, and easily position and fix the resin block with respect to the printed circuit board. Furthermore, when the terminal-equipped printed circuit board is housed in the electrical junction box and used, the block-receiving portions that are separate from the resin block are inserted into the through holes in the printed circuit board, and the resin block can be stably supported from below by the block-receiving portions. For this reason, with a simple structure in which through holes are provided in the printed circuit board, it is possible to easily and efficiently realize the arrangement of the block-receiving portions and the arrangement of the jig at the time of soldering. Note that the block-receiving portions can be provided so as to protrude from a component arranged below the printed circuit board, and can, for example, be provided so as to protrude from an insulating plate, a lower case, or the like that is arranged below the printed circuit board.

Note that a known printed circuit board base material such as paper phenol, paper epoxy, or the like can be adopted as the printed circuit board base material, in addition to FR-4 (material obtained by stiffening a glass woven fabric with epoxy resin) or CEM-3 (material obtained by sandwiching a glass nonwoven fabric with a glass woven fabric and stiffening the resulting fabric with epoxy resin).

A second aspect of the present disclosure is the electrical junction box according to the first aspect, in which the resin block is constituted by the same material as the printed circuit board.

According to this aspect, the resin block and the printed circuit board are constituted by the same material, and therefore the problem of the occurrence of solder cracks caused by the difference in the linear expansion coefficients can be more reliably eliminated or reduced. In addition, this configuration makes it possible to form the resin blocks using the waste board of printed circuit boards, and therefore costs can be further reduced.

A fourth aspect of the present disclosure is the electrical junction box according to the first or second aspect, in which the printed circuit board is configured to be housed in a case, and the block-receiving portion protrudes toward the printed circuit board from a bottom face of the case.

According to this aspect, the block-receiving portion protrudes toward the printed circuit board from the bottom face of the case that houses the printed circuit board. In this manner, when the printed circuit board is housed and arranged in the case, the block-receiving portion protruding from the case can be inserted into an insertion hole of the printed circuit board and arranged at the same time, and therefore the electrical junction box can be easily assembled.

Advantageous Effects of Disclosure

According to the present disclosure, the resin block is formed of a printed circuit board base material. Therefore, compared to the conventional configuration, the problem of the occurrence of solder cracks due to relative displacement caused by the difference in linear expansion coefficients between the printed circuit board and the resin block is advantageously eliminated or reduced. Additionally, the resin block is flatly shaped, and the resin block can thus be formed simply by cutting the flat-shaped printed circuit board base material into a desired size and providing press-fit holes in the base material. Accordingly, unlike conventional leg-equipped resin blocks, it is not necessary to prepare a mold for each type of block, and thus manufacturing costs can be reduced. Additionally, positioning and fixing the resin block with respect to the printed circuit board can be performed using a jig when soldering is performed, and when in use, the resin block can be supported in a state where the resin block is positioned with respect to the printed circuit board by the separate block-receiving portion. As such, even when a flat-shaped resin block without leg portions is adopted, the soldering process can be performed without issue, and supporting the insertion and removal force that occurs when in use can also be realized by the separate block-receiving portion.

DETAILED DESCRIPTION OF PREFERRED EMBODIMENTS

Figure 1:
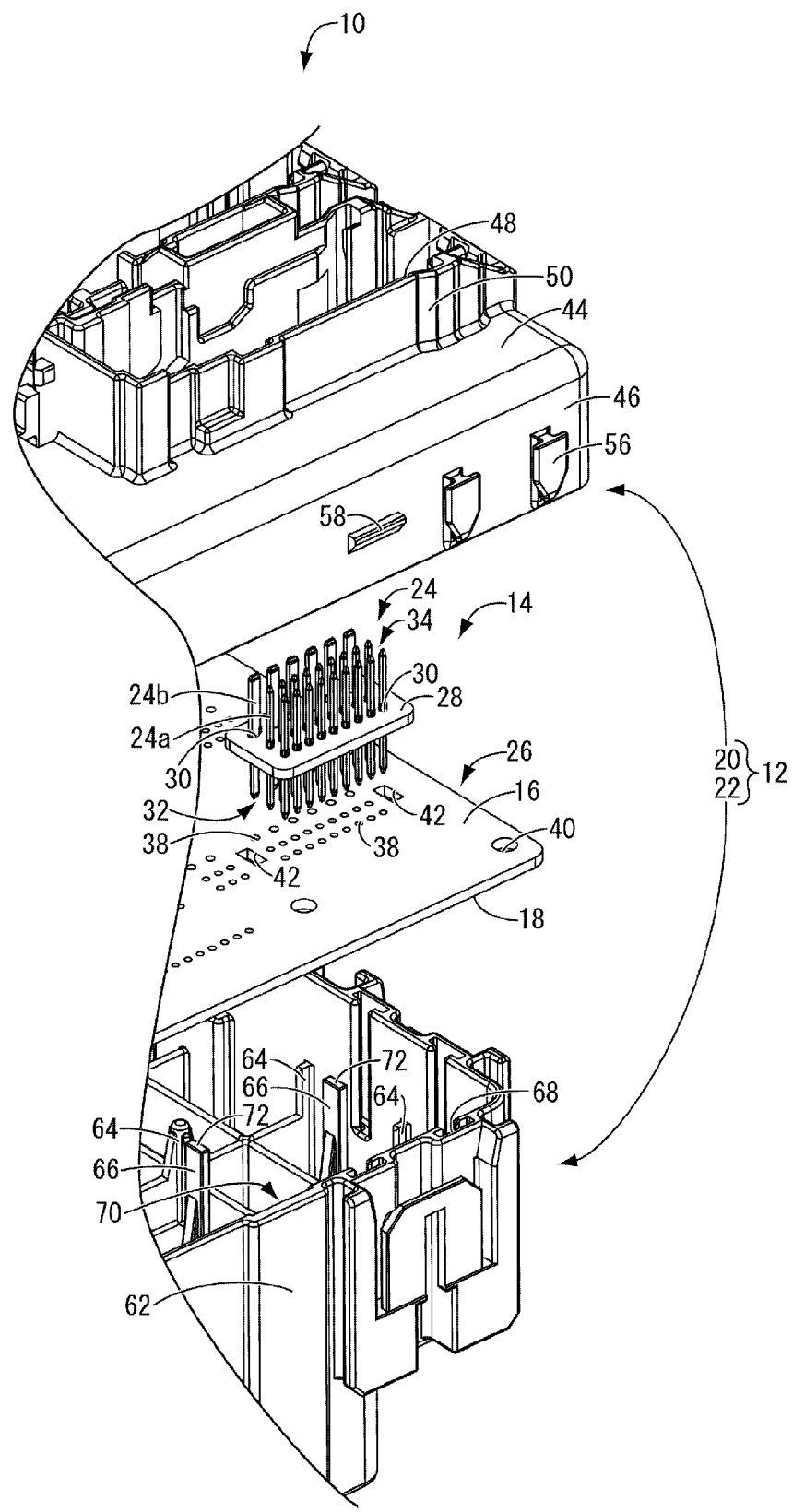
FIG. 1 is an exploded perspective view showing an electrical junction box serving as an embodiment of the present disclosure.

Hereinafter, an embodiment of the present disclosure will be described with reference to the drawings.

FIGS. 1 to 4 illustrates an electrical junction box 10 serving as an embodiment of the present disclosure. The electrical junction box 10 has a configuration in which a terminal-equipped printed circuit board 14 is housed in a case 12. More specifically, the case 12 includes an upper case 20 that covers an upper surface 16 of the terminal-equipped printed circuit board 14 and a lower case 22 that covers a lower surface 18, and the upper case 20 and the lower case 22 are each made of a synthetic resin such as polypropylene (PP) or polyamide (PA), and integrally formed by a method such as injection molding. Note that in the description below, "upward" means upward in FIGS. 1, 2, and 4, "downward" means downward in FIGS. 1, 2, and 4, "forward" means leftward in FIG. 3, "rearward" means rightward in FIG. 3, "length direction" means the left-right direction in FIG. 3, and "width direction" means the up-down direction in FIG. 3.

Figure 2:
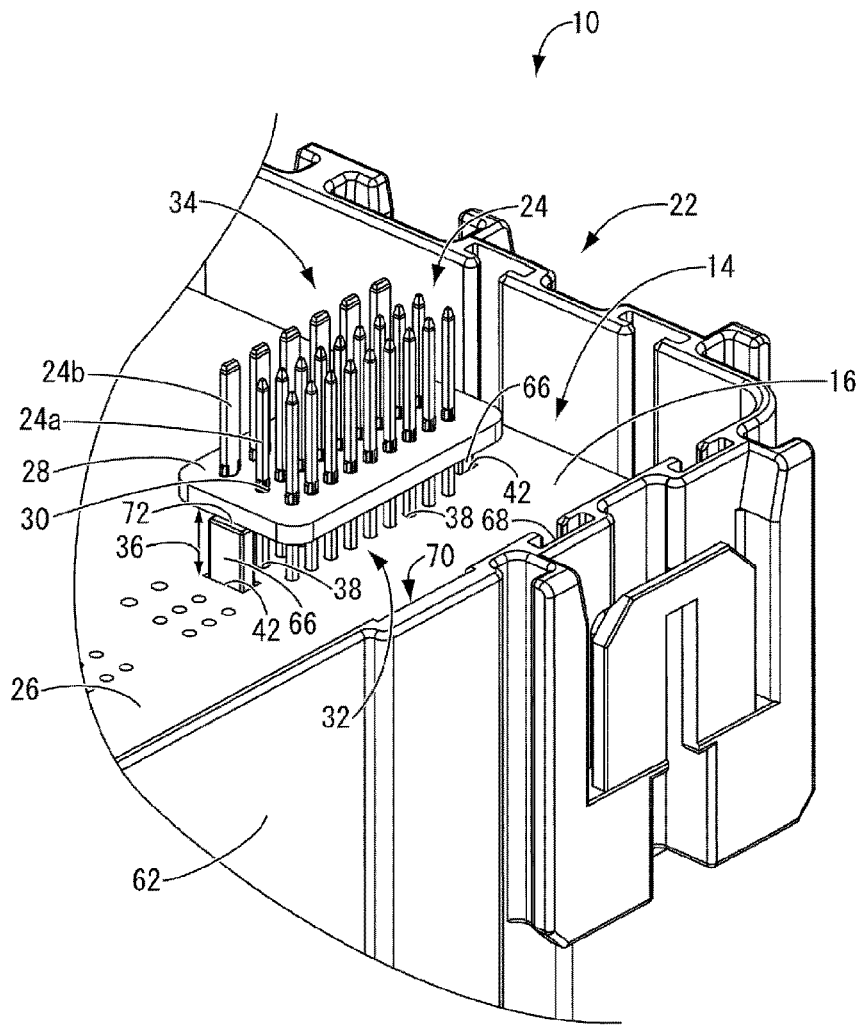
FIG. 2 is an enlarged view showing a state where an upper cover has been removed from the electrical junction box shown in the overall perspective view in FIG. 1.

As shown in FIG. 1, the terminal-equipped printed circuit board 14 is constituted by board terminals 24 standing upright on a printed circuit board 26. More specifically, the board terminal 24 includes 18 approximately rod-shaped board terminals 24*a* and 6 approximately flat-shaped board terminals 24*b*. Here, the board terminals 24*a* are formed by cutting a metal wire into a predetermined length, for example, whereas the board terminals 24*b* are formed by press-punching a metal plate such as a copper plate whose surface is plated with tin or the like. The board terminals 24*a* and 24*b* are used in a state where an intermediate section of the board terminals 24*a* and 24*b* in the length direction (the up-down direction in FIG. 1) is press-fitted into and held by press-fit holes 30 that pass through the resin block 28. In the board terminals 24*a* and 24*b* press-fitted into and held by the resin block 28, one end side (the lower side in FIG. 1) is a lead portion 32 that is conductively connected to a printed wiring serving as a conductive path (not shown) of the printed circuit board 26, whereas the other end side (the upper side of FIG. 1) is a connection portion 34 that protrudes within a connector attachment portion 48 of the later-described upper case 20 and is connected to a partner connector (not shown). Here, the resin block 28 is constituted by the same material as the later-described substantially flat-shaped printed circuit board base material or the printed circuit board 26, and as shown in FIG. 2, is configured to be arranged on the printed circuit board 26 with a gap 36 therebetween in a state of being attached to the printed circuit board 26.

The printed circuit board 26 is an approximately rectangular flat-shaped insulating substrate that is formed of a known insulating material such as glass epoxy resin, and that includes printed wiring (not shown) on surface layers (e.g. the upper surface 16 and the lower surface 18) and inner layers thereof. Note that a known printed circuit board base material such as paper phenol, paper epoxy, or the like, in addition to FR-4 (material obtained by stiffening a glass woven fabric with epoxy resin) or CEM-3 (material obtained by sandwiching a glass nonwoven fabric with a glass woven fabric and stiffening the resulting fabric with epoxy resin) can be adopted as the printed circuit board base material constituting the insulating substrate. Additionally, as shown in FIG. 1, the printed circuit board 26 includes through holes 38 having an approximately circular cross-section in which the lead portions 32 of the board terminals 24*a* and 24*b* are inserted, bolt insertion holes 40 having an approximately circular cross-section that are for bolt-fastening the printed circuit board 26 onto the lower case 22 at the four corners of the printed circuit board 26, and a pair of through holes 42, 42 having an approximately rectangular cross-section in which a pair of block-receiving portions 66, 66 that protrude from the later-described lower case 22 are inserted are located below the two end portions of the resin block 28 in the length direction and are provided in the printed circuit board 26 in the up-down direction. Note that a plating layer connected to the printed wiring (not shown) is formed on the inner surface of each of the through holes 38, and the lead portions 32 of the board terminals 24*a* and 24*b* are configured to be conductively connected to the printed wiring serving as the conductive path (not shown) via solder by inserting the lead portions 32 into the through holes 38 and soldering the lead portions 32 thereto.

Figure 3:
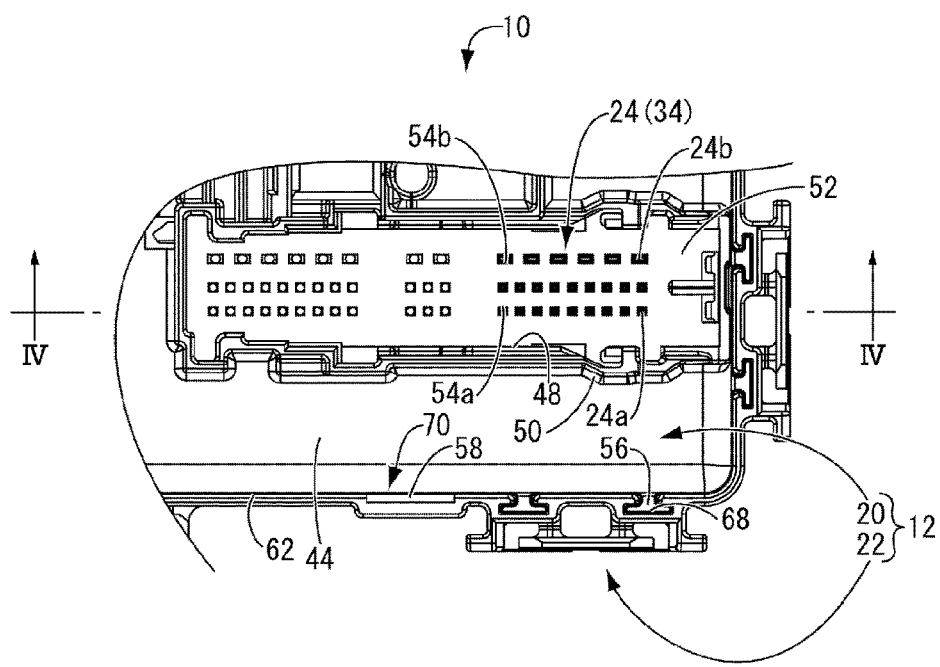
FIG. 3 is an enlarged plan view showing a state where the electrical junction box shown in FIG. 1 has been assembled.
Figure 4:
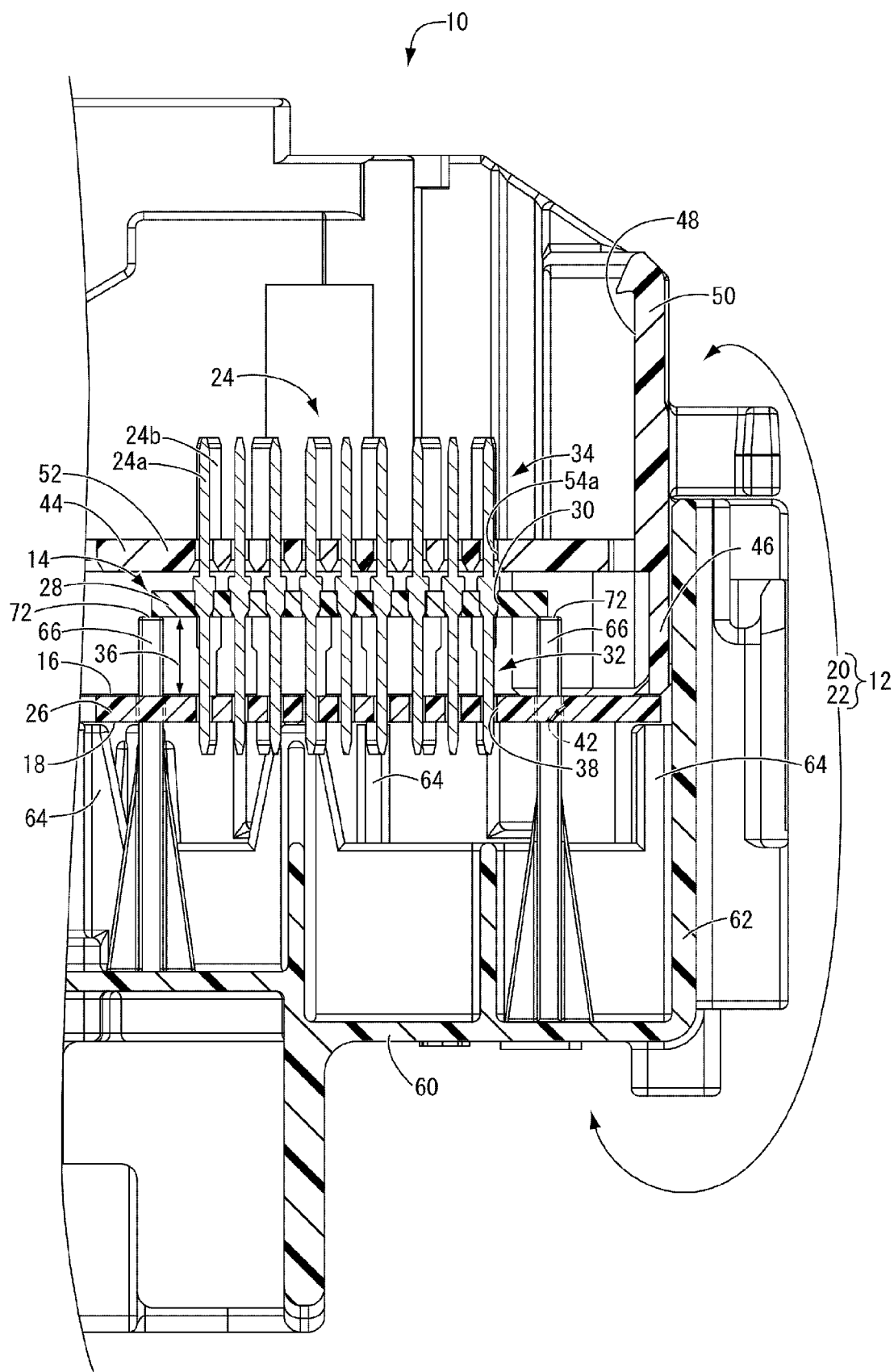
FIG. 4 is an enlarged cross-sectional view taken along the line IV-IV in FIG. 3.

As shown in FIG. 1, the upper case 20 has an approximately box shape opening downward in which a peripheral wall 46 extends downward from an outer peripheral edge portion of an upper wall 44 having an approximately rectangular plate shape. In addition, as shown in FIGS. 1, 3, and 4, on the upper wall 44 of the upper case 20, a connector attachment portion 48 to which the partner connector (not shown) is attached is configured to include a peripheral wall portion 50 having an approximately rectangular tubular shape opening upward, whereas, in a bottom wall 52 of the connector attachment portion 48, 18 connection portion-insertion holes 54*a* and 6 connection portion-insertion holes 54*b* having an approximately rectangular cross-section and provided in the plate-thickness direction are formed. In addition, on a peripheral wall 46 on the near side of the upper case 20, a pair of guide projections 56, 56 having an approximately T-shaped cross-section and extending in the extending direction of the peripheral wall 46, and a locking portion 58 having an approximately triangular cross-section, positioned adjacent to the pair of guide projections 56, and extending in the length direction (the left-right direction of FIG. 3) protrude outward (downward in FIG. 3).

On the other hand, as shown in FIGS. 1, 3, and 4, the lower case 22 has an approximately box shape opening upward as a whole, and includes a bottom wall 60 (see. FIG. 4) having an approximately rectangular flat shape that has the same shape as the upper wall 44 of the upper case 20 in plan view, and a peripheral wall 62 that extends upward, namely, toward the upper case 20, on the outer peripheral edge portion of the bottom wall 60. Additionally, bosses (not shown) that are inserted into the bolt insertion holes 40 of the printed circuit board 26 and bolt-fasten the printed circuit board 26 onto the lower case 22 protrude from the four corners of the bottom wall 60 of the lower case 22, whereas a plurality of supporting projections 64 (see FIGS. 1 and 4) protruding upward, namely, toward the upper case 20, are provided for supporting the lower surface 18 of the printed circuit board 26. Furthermore, as shown in FIGS. 1 and 4, a pair of block-receiving portions 66, 66 having an approximately rectangular cross-section protrude upward, namely, toward the printed circuit board 26 from the bottom wall 60, which is the bottom face of the lower case 22. In addition, as shown in FIGS. 1 to 3, the inner surface of the peripheral wall 62 on the near side of the lower case 22 includes a pair of guide recesses 68, 68 for fitting the pair of guide projections 56, 56 of the upper case 20, and a locked portion 70 that is adjacent to the pair of guide recesses 68, 68 and fits into the locking portion 58 of the upper case 20.

Next, the assembly procedure of the electrical junction box 10 configured as above will be described. First, the terminal-equipped printed circuit board 14 is formed by mounting the board terminals 24 onto the printed circuit board 26 (see FIGS. 1, 2, and 4). More specifically, first, the board terminals 24*a*, 24*b* are press-fitted into the press-fit holes 30 that pass through the resin block 28 such that the intermediate sections of the board terminals 24*a* and 24*b* in the length direction are press-fitted into and held by the press-fit holes 30. In this state, the lead portions 32 on one end side of the board terminals 24*a*, 24*b* are inserted into and arranged in the through holes 38 of the printed circuit board 26 from the upper surface 16 side of the printed circuit board 26. At this time, positioning and arranging the leg portions of the jig (not shown) so as to be inserted into the through holes 42 of the printed circuit board 26 makes it possible to easily position and fix the resin block 28 with respect to the printed circuit board 26 using this jig. Then, flow or reflow soldering is performed, and the lead portions 32 of the board terminals 24*a*, 24*b* are thereby conductively connected to the printed wiring serving as the conductive path (not shown) via the solder and the plating layer inside the through holes 38, and the board terminals 24*a* and 24*b* are configured to stand upright on the printed circuit board 26. In this manner, the terminal-equipped printed circuit board 14 is completed.

Furthermore, the terminal-equipped printed circuit board 14 configured as described above is housed and arranged in the lower case 22, and fastened and fixed to the lower case 22. More specifically, first, the bosses (not shown) provided on the lower case 22 are inserted into and arranged in the bolt insertion holes 40 provided in the four corners of the terminal-equipped printed circuit board 14, while the pair of block-receiving portions 66, 66 protruding from the lower case 22 are arranged so as to be inserted into the pair of through holes 42, 42 that pass through the printed circuit board 26 from the lower surface 18 side of the printed circuit board 26 and protrude toward the resin block 28. In this manner, the two end portions of the resin block 28 in the length direction (the left-right direction of FIG. 4) can be placed on and supported by protruding end faces 72 of the pair of block-receiving portions 66, 66 (see FIG. 4). In other words, the resin block 28 is supported in a fixed position on the printed circuit board 26 by the pair of block-receiving portions 66, 66 that are formed on the lower case 22 separately from the resin block 28. Then, bolt-fastening is performed on the bolt insertion holes 40 in which the bosses (not shown) have been inserted and arranged, and thereby the terminal-equipped printed circuit board 14 is fastened and fixed to the lower case 22 in a state of being housed and arranged in the lower case 22.

Finally, the terminal-equipped printed circuit board 14 housed and arranged in the lower case 22 is covered by the upper case 20 from above, and thereby the electrical junction box 10 according to the present disclosure is completed. More specifically, first, the pair of guide projections 56, 56 provided on the upper case 20 are inserted into the pair of guide recesses 68, 68 provided in the lower case 22. Then, while the upper case 20 is maintained in a horizontal state, the tip end portions of the connection portions 34 provided on the other end side of the board terminals 24*a*, 24*b* are positioned and inserted into the connection portion insertion holes 54a, 54b of the connector attachment portion 48. In this state, the upper case 20 is pressed toward the lower case 22, and thereby the locking portion 58 provided on the upper case 20 is locked and fitted to the locked portion 70 provided on the lower case 22. As a result, the terminal-equipped printed circuit board 14 is housed in the case 12 composed of the upper case 20 and the lower case 22, and the connection portions 34 of the board terminals 24a, 24b protrude within the connector attachment portion 48 provided in the upper case 20.

According to the electrical junction box 10 structured as above, the resin block 28 is constituted by the printed circuit board base material, and therefore the difference in linear expansion coefficients between the printed circuit board 26 and the resin block 28 is advantageously eliminated or reduced compared to a case where the resin block is constituted by a resin material such as polypropylene as in a conventional case. Accordingly, it is possible to advantageously eliminate or reduce the problem of solder cracks that may occur due to stress applied on the soldered parts of the lead portions 32 of the board terminals 24a, 24b that are press-fitted into and held by the resin block 28, on the printed circuit board 26, due to relative displacement between the printed circuit board 26 and the resin block 28 caused by the difference in the linear expansion coefficients. Furthermore, since the resin block 28 has a flat shape, it is possible to easily constitute the resin block 28 by cutting, into a desired size, a flat-shaped printed circuit board base material in which the press-fit holes 30 have been formed. Accordingly, unlike conventional leg-equipped resin blocks, it is not necessary to prepare a mold for each type of block, and thus manufacturing costs can be reduced. In addition, in a case where the resin block 28 and the printed circuit board 26 are constituted by the same base material, the difference in linear expansion coefficients between the printed circuit board 26 and the resin block 28 can be eliminated, and thus the problem of solder cracks that may occur due to the difference in the linear expansion coefficients can be advantageously eliminated. Moreover, the resin block 28 can be formed using the waste material of the printed circuit board 26, thereby making it possible to further reduce costs.

In addition, when the lead portions 32 of the board terminals 24a, 24b that have been press-fitted into and held by the resin block 28 are inserted into the through holes 38 of the printed circuit board 26 and soldered thereto, positioning and arranging the leg portions of the jig (not shown) so as to be inserted into the through holes 42 of the printed circuit board 26 makes it possible to easily position and fix the resin block 28 with respect to the printed circuit board 26 using this jig. Moreover, when the terminal-equipped printed circuit board 14 is housed in the electrical junction box 10 and used, the pair of the block-receiving portions 66, 66 protruding from the lower case 22 are inserted into the pair of the through holes 42, 42 that pass through the printed circuit board 26 from the back surface 18 side of the printed circuit board 26 and arranged so as to protrude toward the resin block 28, and therefore the two end portions of the resin block 28 can be placed on and supported by the protruding end faces 72 of the pair of the block-receiving portions 66, 66. As such, even when a flat-shaped resin block 28 without leg portions is adopted, the soldering process can be performed without issue, and supporting the insertion and removal force that occurs when in use can also be realized by the separate block-receiving portions 66.

Although an embodiment of the present disclosure has been described above in detail, the disclosure is not intended to be limited by the specific descriptions thereof. For example, although the above embodiment describes the block-receiving portions 66 as protruding upward from the bottom wall 60 of the lower case 22, a configuration is also possible in which the block-receiving portions 66 protrude from an insulating plate or the like arranged below the printed circuit board 26.

The invention claimed is:

1. An electrical junction box comprising a terminal-equipped printed circuit board in which an intermediate section of a board terminal in a length direction is press-fitted into and held by a resin block and a lead portion of the board terminal is connected to a conductive path of the printed circuit board by soldering,
   wherein the resin block is formed of a flat-shaped printed circuit board base material, and arranged on the printed circuit board with a gap therebetween,
   the resin block is supported at a fixed position on the printed circuit board by a block-receiving portion that is separate from the resin block, and
   a pair of through holes located below two end portions of the resin block pass through the printed circuit board, a pair of block-receiving portions are inserted into the through holes from a lower surface side of the printed circuit board and are arranged so as to protrude toward the resin block, and the two end portions of the resin block are placed on respective protruding end faces of the pair of block-receiving portions, and the resin block is thereby supported by only the pair of block-receiving portions.

2. The electrical junction box according to claim 1, wherein the resin block is constituted by the same material as the printed circuit board.

3. The electrical junction box according to claim 1, wherein the printed circuit board is configured to be housed in a case, and the block-receiving portion protrudes toward the printed circuit board from a bottom face of the case.

4. The electrical junction box according to claim 2, wherein the printed circuit board is configured to be housed in a case, and the block-receiving portion protrudes toward the printed circuit board from a bottom face of the case.

* * * * *